(12) United States Patent
Nakagawa

(10) Patent No.: US 6,869,457 B2
(45) Date of Patent: Mar. 22, 2005

(54) CLEAN ROOM FOR SEMICONDUCTOR DEVICE

(75) Inventor: Toshiaki Nakagawa, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 104 days.

(21) Appl. No.: 09/985,628

(22) Filed: Nov. 5, 2001

(65) Prior Publication Data

US 2002/0068524 A1 Jun. 6, 2002

(30) Foreign Application Priority Data

Nov. 8, 2000 (JP) ........................................ 2000-340292

(51) Int. Cl.[7] .............................. F24F 3/16; F24F 7/00
(52) U.S. Cl. .............................. 55/385.2; 55/DIG. 18; 55/DIG. 46; 454/187; 454/228; 414/217; 414/222; 414/940
(58) Field of Search ........................ 55/385.2, DIG. 18, 55/DIG. 46; 454/187, 228; 414/217, 222, 940

(56) References Cited

U.S. PATENT DOCUMENTS

| | | | | |
|---|---|---|---|---|
| 4,549,472 A | * | 10/1985 | Endo et al. ................ | 55/385.2 |
| 4,676,144 A | * | 6/1987 | Smith, III .................... | 454/187 |
| 5,058,491 A | * | 10/1991 | Wiemer et al. ............. | 454/187 |
| 5,096,477 A | * | 3/1992 | Shinoda et al. ............. | 454/187 |
| 5,344,365 A | | 9/1994 | Scott et al. | |
| 5,626,820 A | * | 5/1997 | Kinkead et al. ............ | 454/187 |
| 5,876,280 A | * | 3/1999 | Kitano et al. ............... | 454/187 |
| 5,928,077 A | * | 7/1999 | Kisakibaru .................. | 454/187 |
| 5,997,398 A | * | 12/1999 | Yamada et al. ............. | 454/187 |
| 6,033,301 A | * | 3/2000 | Suwa .......................... | 454/187 |
| 6,151,903 A | * | 11/2000 | Hironaka .................... | 454/187 |
| 6,183,358 B1 | * | 2/2001 | Adair, Jr. .................... | 454/187 |
| 6,264,550 B1 | * | 7/2001 | Matsumoto ................. | 454/187 |
| 6,347,990 B1 | * | 2/2002 | Sung et al. ................. | 454/187 |
| 6,358,139 B1 | * | 3/2002 | Renz .......................... | 454/187 |
| 6,368,208 B1 | * | 4/2002 | Minoshima ................. | 454/187 |
| 6,372,042 B1 | * | 4/2002 | Sung et al. ................. | 454/187 |

FOREIGN PATENT DOCUMENTS

| | | |
|---|---|---|
| CN | 1106887 A | 8/1995 |
| CN | 1177709 A | 4/1998 |
| JP | 10-96332 | 4/1998 |
| JP | 10-096332 | 4/1998 |
| JP | 10-106909 A | 4/1998 |
| KR | 1998-066381 | 10/1998 |
| KR | 1999-0086121 | 12/1999 |

OTHER PUBLICATIONS

Taiwanese Office Action
Korean Office Action dated Dec. 12, 2003 (along English translation thereof).
Chinese Office Action dated Nov. 14, 2003 (along English translation thereof).

* cited by examiner

Primary Examiner—Minh-Chau T. Pham
(74) Attorney, Agent, or Firm—Nixon & Vanderhye P.C.

(57) ABSTRACT

A clean room has an equipment installation area where an apparatus for treating an object to be treated such as a semiconductor wafer is installed, a process area 4 where the object is loaded in or unloaded from the apparatus, and an operation area where operations of the apparatus are executed. The equipment installation area, the process area and the operation area are arranged horizontally in the above-stated order and separated by partitions. These areas are air-conditioned independently of one another. The clean room is thus capable of preventing contamination of the object and a running cost of chemical filters in the clean room is reduced.

12 Claims, 3 Drawing Sheets

CLEAN ROOM FOR SEMICONDUCTOR DEVICE

BACKGROUND OF THE INVENTION

The present invention relates to a clean room and typically to a clean room in which semiconductor devices or the like are manufactured.

As a conventional clean room for manufacture of semiconductor devices, a clean room as shown in FIG. 3 has been known (Japanese Patent Laid-Open Publication H10-96332). A whole area of a clean room 101 is divided by a partition 101c into a first area 101a and a second area 101b having air conditioning systems independent of each other. A manufacturing apparatus 114a, a conveying apparatus 127, a storage apparatus 128 and the like are installed in a working zone 126a that is subjected to air conditioning in the first area 101a. On the other hand, a manufacturing apparatus 114b that generates chemical mist is installed in a working zone 126b that is subjected to air conditioning in the second area 101b. In the first area 101a, air from an external air conditioner 111 in which the air has been subjected to dust removal and humidity control as well as chemical-free air from chemical-free air feeding apparatus 123 in which the air becomes free of chemically reactive components, together with described-below circulating air, are fed into the working zone 126a through a ceiling chamber 124a, fan filter units 125 having chemical filters 112 and non-chemical filters 130a. The non-chemical filters 130a are HEPA (High Efficiency Particulate Air) filters and ULPA (Ultra Low Penetration Air) filters and the like. Air fed into the working zone 126a is forwarded through a grating floor 107a (a floor shaped like a draining board) down to a utility zone 129a. The air is then returned to the ceiling chamber 124a via the utility zone 129a through a temperature controlling apparatus 132a, a circulating fan 131a and a circulation duct 109a. In the second area 101b, air from the external air conditioner 111 in which the air has been subjected to humidity control, together with the described-below circulating air, is fed through a ceiling chamber 124b and non-chemical filters 130b into the working zone 126b. Air fed into the working zone 126b is forwarded through a grating floor 107b down to a utility zone 129b and is then returned to the ceiling chamber 124b via the utility zone 129b through a chemical filter 110, a temperature controlling apparatus 132b, a circulating fan 131b and a circulation duct 109b. As a result, most of air fed into the first area 101a and the second area 101b circulates only in the first area 101a and only in the second area 101b, respectively. Part of air fed into the working zones 126a, 126b is discharged from the clean room 101 through ducts (not shown) by local ventilators installed in the manufacturing apparatus 114a, 114b and the like. This arrangement is intended for preventing cross contamination between the area 101a and the area 101b.

In the conventional clean room 101, however, the manufacturing apparatus 114a, the conveying apparatus 127, the storage apparatus 128 and the like exist together in one working zone 126a where air circulates. Accordingly, dust such as particulate produced from anywhere in the working zone 126a might contaminate an exposed semiconductor wafer that has been transferred from the conveying apparatus 127 to the manufacturing apparatus 114a.

In the first area 101a, air that has passed through the chemical filters 112 and air that has passed through the non-chemical filters 130a mix with each other in a circulation process in the working zone 126a and in later processes, so that loads on the chemical filters 112 increase. This is because chemical mist (atoms or ions of sodium, potassium, aluminum, iron, cobalt, nickel, copper, ammonia and the like) that causes chemical contamination is generated not only from the manufacturing apparatus but also by conveyance of objects and movement of workers in the working zone 126a. Loads on the chemical filter 110 is also increased in the second area 101b because the chemical filter 110 is passed through by air from the whole area of the working zone 126b, that is, air not only from an area for the manufacturing apparatus 114b but also from an area for workers moving around the apparatus. As a result, the chemical filters 112 and 110 have to be replaced frequently, for example, at intervals of several months to several years. A running cost of the chemical filters is thereby increased.

The non-chemical filters 130a and 130b such as HEPA and ULPA make little problem on running cost, because unit costs of such non-chemical filters are not higher than about one-third of those of chemical filters and because replacement frequencies of non-chemical filters may be smaller than those of chemical filters.

SUMMARY OF THE INVENTION

An object of the present invention is to provide a clean room which prevents contamination of objects to be treated such as semiconductor wafers and which allows a running cost of a chemical filter to be reduced.

In order to achieve the object, the present invention provides a clean room comprising:

an equipment installation area where apparatus for treating an object to be treated is installed;

a process area where the object to be treated is loaded in the apparatus or unloaded from the apparatus; and an operation area where the apparatus is operated, wherein the equipment installation area, the process area and the operation area are so horizontally arranged in above-stated order as to be separated from one another via a partition, and wherein the equipment installation area, the process area and the operation area are air-conditioned independently of one another.

According to the present invention, the equipment installation area, the process area and the operation area are air-conditioned independently of one another. Accordingly, dust such as particulates generated in the equipment installation area or in the operation area does not contaminate the object to be treated that are exposed in the process area. Contamination of the object can be thus prevented.

In one embodiment of the present invention, the process areas is air-conditioned with use of air that passes through a chemical filter, and the equipment installation area and the operation area are air-conditioned with use of air which passes through respective non-chemical filters.

According to this embodiment, cleanliness normally required in these areas can be easily achieved because air conditioning in the process area is performed with use of air that passes through the chemical filter and air conditioning in the equipment installation area and in the operation area is performed with use of air that passes through respective non-chemical filters. Besides, air that passes through the chemical filter circulates only in the process areas without mixing with air in the equipment installation area and in the operation area. Therefore, the chemical filter is not easily contaminated in comparison with the prior art. Accordingly, a running cost of the chemical filter can be made lower than that of chemical filters in conventional clean rooms.

Herein, a "chemical filters" refer to a filter for removing chemical mist (atoms or ions of sodium, potassium, aluminum, iron, cobalt, nickel, copper, ammonia and the like) that causes chemical contamination of the object to be treated, with use of chemical reactions, and a "non-chemical filter" refer to a filter for trapping and removing particulates physically without making use of any chemical reactions. The non-chemical filter is a HEPA (High Efficiency Particulate Air) filter and a ULPA (Ultra Low Penetration Air) filter, for example.

In one embodiment of the present invention, the clean room further comprises:

- a ceiling chamber provided under a ceiling in each of the equipment installation area, the process area and the operation area;
- an objective region provided under the ceiling chamber and air-conditioned through a specified filter;
- an underfloor region is provided under the objective region via a grating floor; and
- a circulation duct through for returning air from the underfloor region to the ceiling chamber is provided.

Accoding to the embodiment, air is fed from the ceiling chamber through the specified filter to the objective region in each of the equipment installation area, the process area and the operation area. Air fed to the objective region flows through the grating floor into the underfloor region and returns from the underfloor region through the circulation duct to the ceiling chamber. In the ceiling chamber, air returned from the underfloor region is mixed with a comparatively small amount of air (subjected to appropriate conditioning such as dust removal and chemical removal according to a required cleanliness) taken in from outside of the clean room. The mixed air is again fed to the objective region through the filters. In the clean room, air conditioning in the areas is thus performed on a circulating system, which lessens loads on the filters provided in the areas. As a result, a running cost of the filters can be reduced.

In one embodiment of the present invention, a plurality of process zones, each of which is formed by combination of the equipment installation area and the process area, are horizontally arranged via the operation area, and air conditioning in the plurality of process zones is performed independently of one another.

According to this embodiment, a degree of cleanliness can be individually set in each process zone and therefore can be set in accordance with a type of equipment that is installed in each process zone for the purpose of treating objects to be treated.

In one embodiment of the present invention, an internal clean area formed by the plurality of process zones and the operation area is surrounded by a peripheral passage area via a partition, and the peripheral passage area is air-conditioned independently of the internal clean area.

According to this embodiment, the peripheral passage area functions as a buffer area between a space outside the clean room and the internal clean area. Air conditioning in the internal clean area is therefore performed stably without being influenced by an environment outside the clean room.

In one embodiment of the present invention, an auxiliary machine area, in which an auxiliary machine for assisting an operation of the apparatus is installed, is provided under the internal clean area via a planar floor, and the auxiliary machine area is air-conditioned independently of the internal clean area.

According to the embodiment, the auxiliary machine is installed under the internal clean area via the planar floor. Operations of the apparatus can be assisted with the auxiliary machine vertically connected to the apparatus through piping. This arrangement allows an area and a volume of the equipment installation area to be made smaller than those of the equipment installation area in which the auxiliary machine is installed together with the apparatus. The above arrangement also allows a length of the piping can practically to be made smaller than that in the conventional case that the auxiliary machine are installed outside the clean room.

Besides, in the clean room of the embodiment, the auxiliary machine area is air-conditioned independently of the internal clean area, so that a cleanliness required in the internal clean area is not impaired and can be achieved easily.

Herein, an "auxiliary machine" refers to equipment that does not directly deal with the object to be treated but assists operations of the apparatus. Examples of the "auxiliary machine" are a pump unit for evacuating air through piping from the apparatus that requires a vacuum; a heat exchanger for cooling the apparatus by circulating cooling water through two-way piping in the apparatus; and a harm eliminating device for taking in harmful substances from the apparatus through piping when the apparatus discharges the substances harmful to a human body, changing the substances into harmless substances, and discharging the harmless substances from the clean room.

In one embodiment of the present invention, a plurality of the auxiliary machines are installed in a common auxiliary machine area in which air circulates.

According to the embodiment, air conditioning in the auxiliary machine area is made easier than in the case that an independent auxiliary machine area is provided for each auxiliary machine.

In one embodiment of the present invention, the common auxiliary machine area communicates with the peripheral passage area to air-condition the auxiliary machine area and the peripheral passage area in common.

According to the embodiment, air conditioning in those areas is made easier than in the case that the areas are air-conditioned independently of each other.

In one embodiment of the present invention, an air pressure in an area requiring a high degree of cleanliness is set higher than an air pressure in an area requiring a low degree of cleanliness in the internal clean area.

According to the embodiment, dust is prevented from flowing into an area that requires a high degree of cleanliness from an area that requires a low degree of cleanliness. As a result, cleanliness in an area that requires a high degree of cleanliness is kept satisfactory.

In one embodiment of the present invention, the object to be treated is conveyed from one of the process zones to another of the process zones only through the operation area.

According to the embodiment, since the object to be treated is conveyed only through the operation area from one of the process zones to another thereof, the objects do not pass through the equipment installation area. Accordingly, the object can be prevented from being contaminated with chemical mist which the apparatus in the equipment installation area generates.

In one embodiment of the present invention, an operator on the grating floor is allowed to come and go only between the peripheral passage area and the operation area and between the peripheral passage area and the equipment installation area.

According to the embodiment, workers are not allowed to enter the process areas and are not allowed to come and go directly between the operation area and the equipment installation areas. Consequently, turbulence in air conditioning caused by traffic of workers is minimized.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, one embodiment of a clean room according to the present invention will be described in detail with reference to the accompanying drawings.

Figure 1:
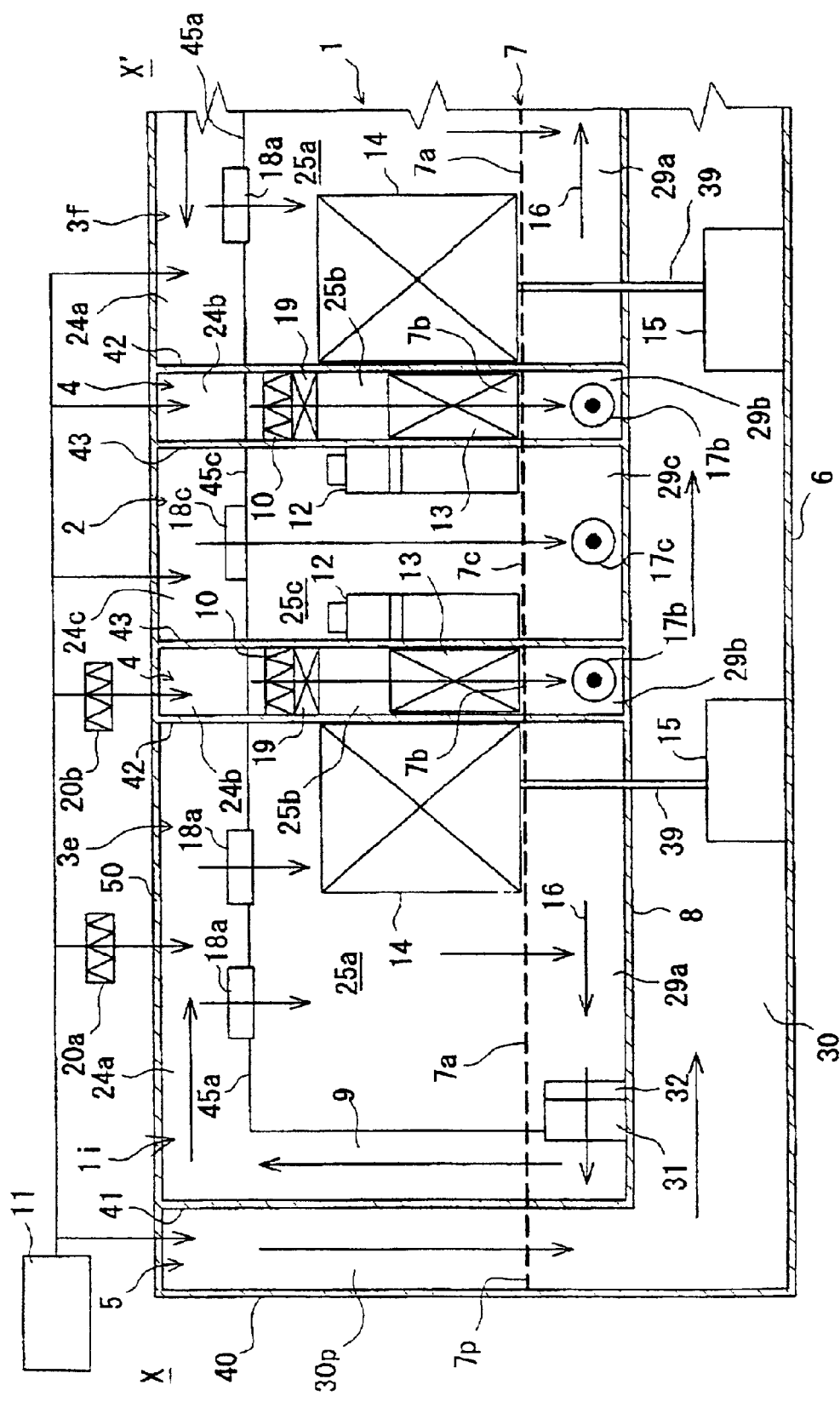
FIG. 1 is a vertical section view of part of a clean room according to an embodiment of the present invention.
Figure 2:
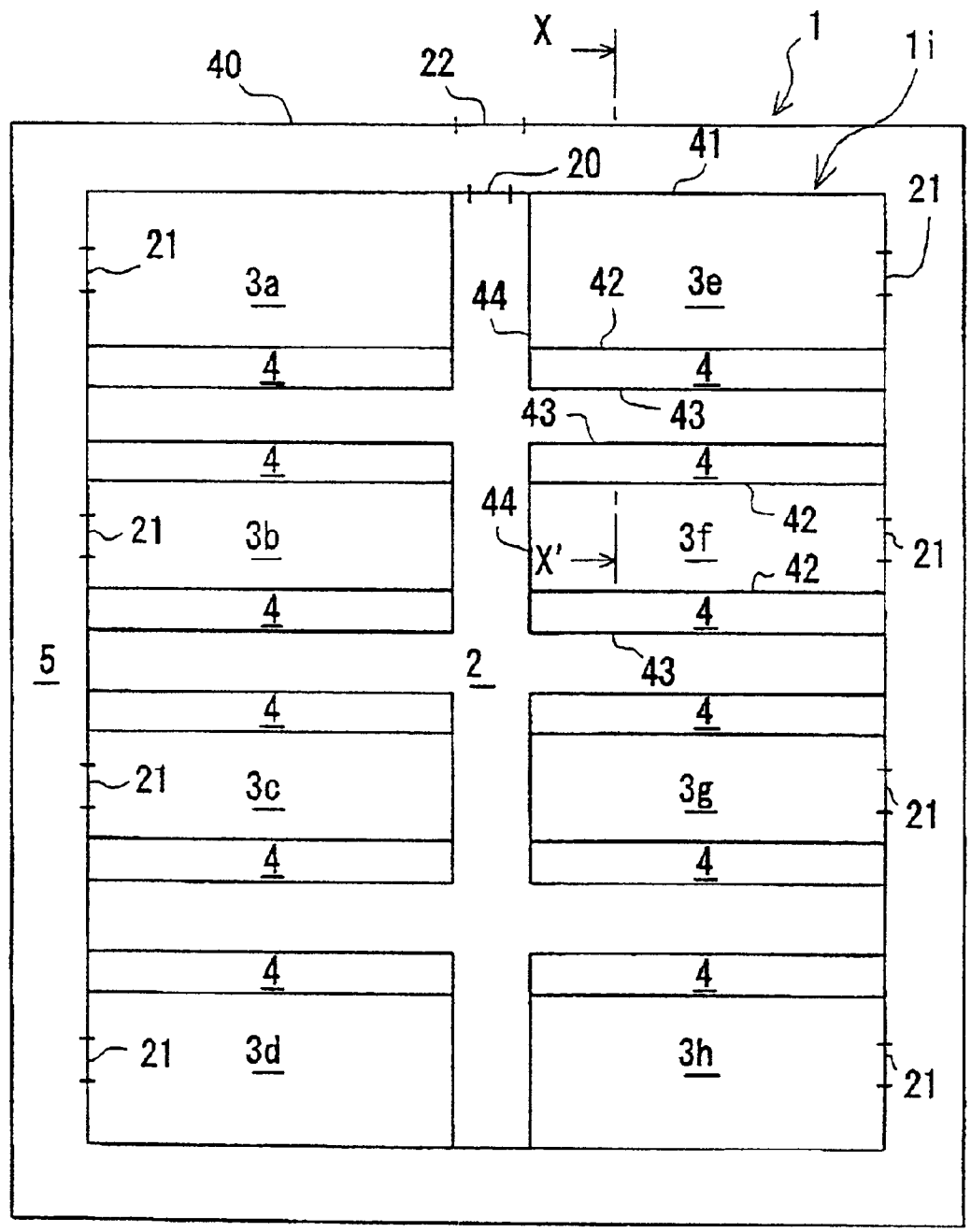
FIG. 2 is a view illustrating a layout in plan of the clean room.
Figure 3:
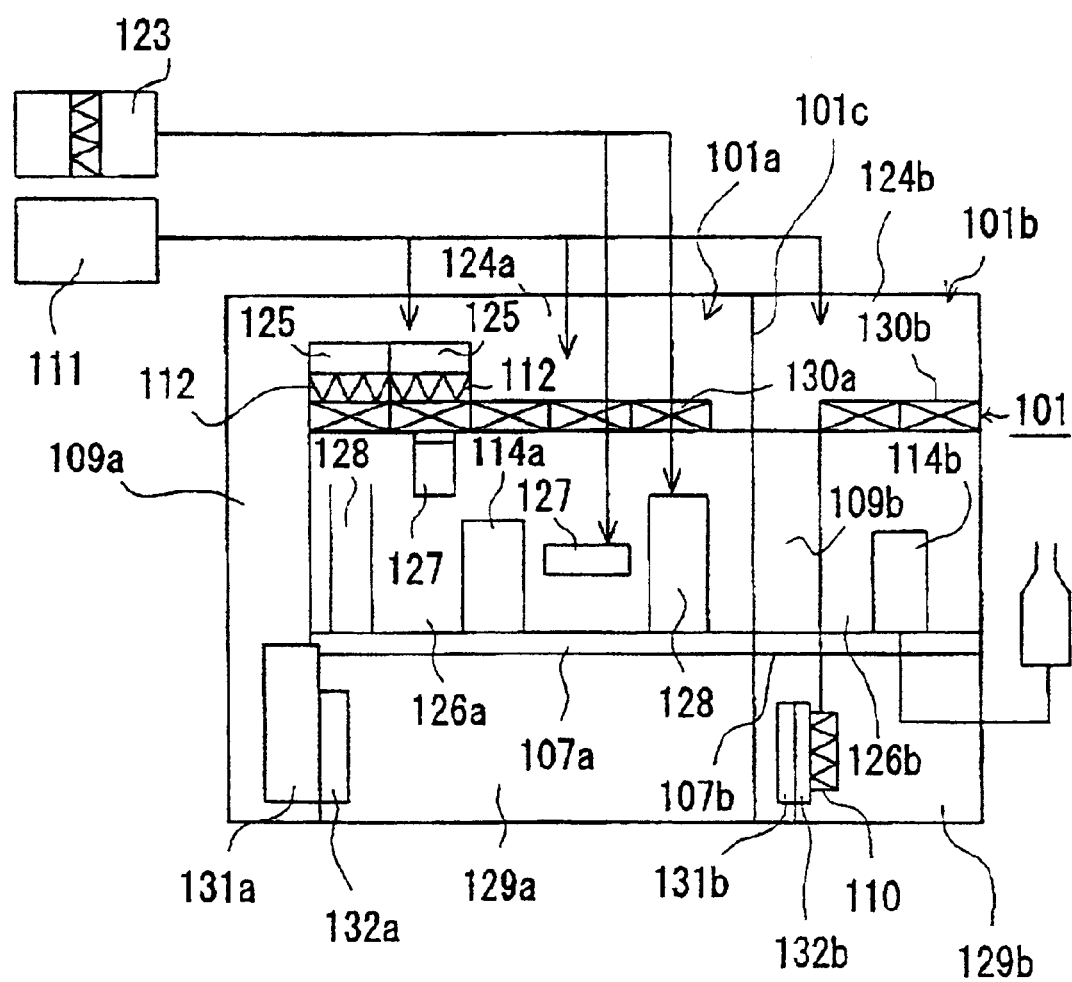
FIG. 3 is a vertical section view of a conventional clean room.

FIG. 1 shows a vertical section of a clean room 1 for manufacturing semiconductor devices, which is taken along a line X–X' in FIG. 2. FIG. 2 shows a layout in plan of the clean room 1.

In FIG. 2, reference character 3a denotes an equipment installation area where an ion injecting apparatus is installed. Character 3b denotes an equipment installation area where a photo-lithography apparatus is installed. Character 3c denotes an equipment installation area where a dry etching apparatus is installed. Character 3d denotes an equipment installation area where a CMP apparatus is installed. Character 3e denotes an equipment installation area where an oxidizing and diffusing apparatus is installed. Character 3f denotes an equipment installation area where a wet cleaning apparatus is installed. Character 3g denotes an equipment installation area where a CVD apparatus is installed. Character 3h denotes an equipment installation area where a metal film forming apparatus is installed. Hereinbelow, the equipment installation areas will be represented by reference character 3 as necessary. The above apparatus are installed as equipment for applying specified treatments respectively to semiconductor wafers (that will be referred to merely as "wafers" hereinbelow) as objects to be treated.

As shown in FIG. 2, one or two process areas 4 adjoin each of the equipment installation areas 3. Combination of an equipment installation area 3 with one or two process areas 4 forms a process zone. A plurality of process zones are vertically and horizontally arranged in four rows and two columns via an operation area 2 for this example The process area 4 is for loading or unloading of wafers into or from equipment installed in the equipment installation area 3 adjacent to the process area 4. The equipment installation area 3 and the adjoining process area 4 are separated by a partition 42 shaped into a generally flat plate. The process zone and the operation area 2 are separated by a partition 43, 44 shaped into a generally flat plate. A peripheral passage area 5 surrounds a rectangular area 1i in which the process zones are arranged in four rows and two columns (the rectangular area will be referred to as "internal clean area" hereinbelow). The peripheral passage area 5 and the internal clean area 1i are separated by a partition 41. A peripheral wall 40 is provided as a boundary on the outside of the peripheral passage area 5. The peripheral wall 40 defines outside of the clean room 1.

The process zones arranged in the internal clean area 1i are air-conditioned independently of one another, and the operation area 2 is air-conditioned independently of air conditioning in the process zones. Accordingly, cleanliness in each process zone can be set individually in accordance with a type of equipment that is installed in the process zone for the purpose of treating objects to be treated. On the other hand, the peripheral passage area 5 is air-conditioned independently of air conditioning in the internal clean area 1i. Accordingly, the peripheral passage area 5 functions as a buffer area between an outside of the clean room 1 and the internal clean area 1i. Therefore, the internal clean area 1i is stably air-conditioned without being influenced by an environmental change outside the clean room 1.

On the peripheral wall 40 is provided a door 22 through which workers (apparatus operators and maintenance persons) come and go between the outside of the clean room 1 and the peripheral passage area 5. On the partition 41 are provided a door 20 through which workers (mainly, apparatus operators) come and go between the peripheral passage area 5 and the operation area 2, and doors 21 through which workers (mainly, maintenance persons) come and go between the peripheral passage area 5 and the equipment installation areas 3. There are provided no doors but the above-mentioned doors. As a result, workers are allowed to come and go only between the peripheral passage area 5 and the operation area 2 and between the peripheral passage area 5 and the equipment installation areas 3 in the internal clean area 1i. That is, workers are not allowed to enter the process areas 4 and are not allowed to come and go directly between the operation area 2 and the equipment installation areas 3. Consequently, turbulence in air conditioning caused by traffic of workers is minimized.

As shown in FIG. 1, the clean room 1 has a grating floor 7 (including portions 7a, 7b, 7c, and 7p), a planar floor 8 provided beneath the floor 7, and a planar floor 6 provided beneath the floor 8. It is on the grating floor 7 that workers come and go.

The above-mentioned partitions 41, 42 and 43 extend from a ceiling 50 to the floor 8. Between the ceiling 50 and the floor 8, spaces defined by the partitions 41 and 42 are for the equipment installation areas 3, spaces defined by the partitions 42 and 43 are for the process areas 4, and a space defined by the partitions 43 and 43 (and partitions 44 and 44 in FIG. 2) is for the operation area 2. In the process areas 4, wafers are exposed directly to airflow, as will be described below. Therefore, cleanliness in the process areas 4 has to be made higher than that in the other areas 3 and 2. Thus capacities of the process areas 4 are set as small as possible in consideration of an efficiency of air conditioning.

In the vicinity of the ceiling 50 of the equipment installation areas 3 and the operation area 2, there are provided ceiling panels 45a and 45c in which HEPA filters 18a and 18c are installed, respectively. Ceiling chambers 24a and 24c are thereby formed between the ceiling 50 and the ceiling panels 45a and 45c, respectively. In the vicinity of the ceiling 50 of each process area 4, a chemical filter 10 and an ULPA filter 19 are installed in a laminated state between the partitions 42 and 43, so that a ceiling chamber 24b is formed between the ceiling 50 and the chemical filter 10.

Since it is only in the process areas 4 that the chemical filters 10 are provided in the internal clean area 1i, an initial cost of provision of the chemical filters can be reduced in comparison with that of chemical filters used in conventional clean rooms.

Objective regions 25a, 25b, and 25c to be air-conditioned are a region extending from the ceiling panel 45a to the grating floor 7a in each equipment installation area 3, a region extending from the ULPA filter 19 to the grating floor 7b in each process area 4, and a region extending from the ceiling panel 45c to the grating floor 7c in the operation area 2, respectively. The above-mentioned apparatus 14 is installed in the objective region 25a in the equipment installation area 3. A wafer conveying robot 13 is installed in the objective region 25b in the process area 4. A SMIF (Standard Mechanical Interface) box 12, which is publicly known, is provided in the objective region 25c in the operation area 2.

In the operation area 2, The SMIF box 12 with a wafer carrier accommodated therein is carried to a port of the apparatus 14 by a worker. Wafers are then taken into a process area 4 by a conveying robot 13, and are loaded from the wafer carrier into the apparatus 14 in a state of direct exposure to airflow. After being treated in the apparatus 14, the wafers are unloaded from the apparatus 14 to be taken again into the SMIF box 12 by the conveying robot 13 in the process area 4, and returned to the operation area 2. If the apparatus 14 installed in the equipment installation area 3 is of type having a vacuum chamber, the movement of wafers causes no interference between air conditioning in the operation area 2 and that in the process area 4. If the apparatus 14 installed in the equipment installation area 3 is of type having no vacuum chamber (e.g., atmospheric-pressure type), the movement of wafers temporarily causes interference between air conditioning in the operation area 2 and that in the process area 4. However, a quantity of the interference is small. Conveyance of the wafers between processes is executed by an SMIF system, that is, by movement of the SMIF box 12 accommodating the wafer carrier by an apparatus operator. In other words, wafers are conveyed from a process zone to another process zone only through the operation area 2, which does not require the operator to carry the wafers through the equipment installation areas 3. Accordingly, the wafers are prevented from being contaminated with chemical mist generated by the apparatus installed in the equipment installation areas 3. Besides, wafers are prevented from being exposed to airflow in the operation area 2 because the wafers are accommodated in the SMIF boxes 12 there. Contamination of wafers can be thus prevented.

In each equipment installation area 3, a circulating fan 31 is installed in an underfloor region 29a between the grating floor 7a and the floor 8 and near an end wall on left side shown in FIG. 1. The circulating fan 31 is equipped with a temperature controller 32 on a front side of the circulating fan 31. On rear side of the circulating fan 31 is provided a circulation duct 9 that extends vertically so as to connect the underfloor region 29a to the ceiling chamber 24a. In each process area 4, a circulating fan is installed in an underfloor region 29b between the grating floor 7b and the floor 8 and near an end wall which is not shown in FIG. 1 but on the near side thereof. The circulating fan is equipped with a temperature controller on a front side thereof, as in the case of the circulating fan 31. On rear side of the circulating fan is also provided a circulation duct (not shown) that extends vertically so as to connect the underfloor region 29b to the ceiling chamber 24b. In the same manner as the above, in the operation area 2, a circulating fan equipped with a temperature controller on a front side thereof is installed in an underfloor region 29c between the grating floor 7c and the floor 8 and near an end wall not shown in FIG. 1 but on the near side thereof. On rear side of the circulating fan is provided a circulation duct (not shown) that extends vertically so as to connect the underfloor region 29c to the ceiling chamber 24c.

Outside the clean room 1 is provided an external air conditioner 11 for feeding air that has been subjected to dust removal and humidity control. Air delivered by the external air conditioner 11 is fed to the ceiling chamber 24a in the equipment installation areas 3, to the ceiling chamber 24b in the process areas 4, and to the ceiling chamber 24c in the operation area 2 basically without passing through chemical filters. However, air delivered by the external air conditioner 11 is fed through chemical filters 20a and 20b, which are capable of removing organic substances, to ceiling chamber 24a in the equipment installation area 3e where the oxidizing and diffusing apparatus are installed and to ceiling chamber 24b in the adjoining process area 4, respectively. This is because an oxidizing and diffusing processes are apt to be negatively affected by organic substances as chemical mist. On the other hand, a photo-lithography process is apt to be negatively affected by ammonia as chemical mist. Therefore, air delivered by the external air conditioner 11 is fed through chemical filters (not shown) capable of removing ammonia to the ceiling chamber in the equipment installation area 3a where the photo-lithography apparatus is installed and to the ceiling chamber in the adjoining process area 4.

Air fed from the external air conditioner 11 to the ceiling chamber 24a in each equipment installation area 3, together with below-described circulating air, is purified through the HEPA filters 18a. The purified air is subsequently fed to the objective region 25a so as to flow into the underfloor region 29a through the grating floor 7a. Air flowed into the underfloor region 29a is moved in a horizontal direction (as shown with arrows 16 in FIG. 1) by rotation of the circulating fan 31. Thereafter, the air is subjected to temperature control by the temperature controller 32, and delivered through the circulating fan 31 into the circulation duct 9 to be returned to the ceiling chamber 24a. In the ceiling chamber 24a, air returned from the underfloor region 29a through the circulation duct 9, that is, circulating air is mixed with a comparatively small amount of air fed from the external air conditioner 11. The mixed air is fed to the objective region 25a through the HEPA filters 18a. Most of air fed to the objective region 25a makes circulating air. However, a portion of the fed air is discharged from the clean room 1 through ducts (not shown) by local ventilating means installed in the apparatus 14 and the like (in the form of exhaust from gas boxes, heat exhaust or the like).

Air fed from the external air conditioner 11 to the ceiling chamber 24b in each process area 4, together with below-described circulating air, is purified through the chemical filter 10 and the ULPA filter 19. Subsequently, the air is fed to the objective region 25b to flow into the underfloor region 29b through the grating floor 7b. Air flowed into the underfloor region 29b is moved in a horizontal direction (a direction toward near side as shown by reference character 17b in FIG. 1) by rotation of the circulating fan. Thereafter, the air is subjected to temperature control by the temperature controller, and delivered through the circulating fan into the circulation duct, which connects the underfloor region 29b to the ceiling chamber 24b, so as to be returned to the ceiling chamber 24b. In the ceiling chamber 24b, air returned from the underfloor region 29b through the circulation duct, that is, circulating air is mixed with a comparatively small amount of air fed from the external air conditioner 11. The mixed air is fed to the objective region 25b through the chemical filter 10 and the ULPA filter 19.

In the same manner, air fed from the external air conditioner 11 to the ceiling chamber 24c in the operation area 2, together with below-described circulating air, is purified through the HEPA filters 18c. Subsequently, the air is fed to the objective region 25c to flow into the underfloor region 29c through the grating floor 7c. Air flowed into the underfloor region 29c is moved in a horizontal direction (a direction toward near side as shown by reference character 17c in FIG. 1) by rotation of the circulating fan. Thereafter, the air is subjected to temperature control by the temperature controller, and delivered through the circulating fan into the circulation duct, which connects the underfloor region 29c to the ceiling chamber 24c, so as to be returned to the ceiling chamber 24c. In the ceiling chamber 24c, air returned from the underfloor region 29c through the circulation duct, that is, circulating air is mixed with a comparatively small amount of air fed from the external air conditioner 11. The mixed air is fed to the objective region 25c through the HEPA filters 18c.

Air conditioning in the areas 3, 4, and 2 in the clean room 1 is thus performed on a circulating system, which decreases loads on the filters 18a, 10, 19, and 18c provided in the areas 3, 4, and 2. As a result, a running cost of the filters 18a, 10, 19, and 18c is reduced. Besides, air conditioning in the areas 3, 4, and 2 is performed independently of one another. Accordingly, wafers exposed in the process areas 4 are not contaminated by dust such as particulates generated, for example, in the equipment installation areas 3 or in the operation area 2. According to normally required cleanliness, air conditioning by circulating air in the process areas 4 is performed with use of the chemical filters 10, and air conditioning by circulating air in the equipment installation areas 3 and the operation area 2 is performed with use of air that passes only through the non-chemical filters 18a and 18c, respectively. That is, circulating air passing through the chemical filter 10 circulates only in the process area 4, and is not mixed with circulating air in the equipment installation areas 3 and in the operation area 2. Loads on the chemical filters 10 are therefore made smaller than those in prior arts. Thus a running cost of the chemical filters 10 can be made lower than that of chemical filters used in conventional clean rooms.

An auxiliary machine area 30 is provided under the planar floor 8 of the internal clean area 1i in common to the plurality of process zones. The auxiliary machine area 30 is provided with auxiliary machines 15 for assisting operations of the apparatus 14 in the process zones. The reason why the auxiliary machine area 30 is common to the plurality of process zones in this manner is that air conditioning in the auxiliary machine area 30 is thereby made easier than in the case that an independent auxiliary machine area is provided for each auxiliary machine 15. Examples of the auxiliary machines 15 are a pump unit, a heat exchange unit, a harm eliminating device and the like. The pump unit evacuates air from the apparatus 14 through piping to form a vacuum in the apparatus 14. The heat exchange unit cools the apparatus 14 by circulating cooling water in an apparatus 14 through two-way piping. The harm eliminating device takes harmful substances through piping from an apparatus 14 that discharges the harmful substances to a human body, then changes the harmful substances into harmless ones, and discharges the harmless substances from the clean room 1.

In this embodiment, an operation of an apparatus 14 is assisted by an auxiliary machine 15 connected to the apparatus 14 through piping 39. This arrangement makes an area and a volume of the equipment installation area 3 smaller than those of an equipment installation area in which the auxiliary machine 15 is installed together with the apparatus 14. The piping 39 connecting between the apparatus 14 and the auxiliary machines 15 is provided in a vertical direction. A length of the piping 39 can practically be made smaller compared with the case that piping is provided in the horizontal direction so that the auxiliary machines 15 may be installed to the outside of the clean room 1.

In the embodiment, the auxiliary machine area 30 communicates with the peripheral passage area 5 through the grating floor 7p and a duct section 30p. The auxiliary machine area 30 and the peripheral passage area 5 are therefore air-conditioned in common by air fed from the external air conditioner 11. Air conditioning in those areas is thereby made easier than the case that the areas are air-conditioned independently of each other. The auxiliary machine area 30 and the peripheral passage area 5 are separated from the internal clean area 1i by the partition 41 and the planar floor 8, respectively. Therefore, the auxiliary machine area 30 and the peripheral passage area 5 are air-conditioned independently of the internal clean area 1i. Consequently, a cleanliness required in the internal clean area 1i can be achieved easily because cleanliness of the internal clean area 1i is not impaired by the auxiliary machine area 30 and/or the peripheral passage area 5. Air fed into the auxiliary machine area 30 is discharged to the outside of the clean room 1 through ducts (not shown) by the local ventilating means installed in the auxiliary machines 15.

With regard to air pressure in the above-mentioned areas, a pressure in the process areas 4 where wafers are exposed to airflow is set highest. Pressures are set higher in order of the process areas 4, the operation area 2, the equipment installation areas 3, the peripheral passage area 5 and the auxiliary machine area 30. In other words, an air pressure in an area that requires a high degree of cleanliness is set higher than an air pressure in an area that requires a low degree of cleanliness. A difference between the pressures in the areas is 0.2 mm $H_2O$. With such an arrangement, dust is not flowed from an area that requires a low degree of cleanliness into an area that requires a high degree of cleanliness. Therefore, the area requiring a high degree of cleanliness is satisfactorily maintained to be highly clean. For example, dust is prevented from flowing from the operation area 2 into the process area 4 when wafers are moved from the operation area 2 to the process area 4 or when wafers are returned from the process area 4 to the operation area 2 in reverse. When the door 20 between the peripheral passage area 5 and the operation area 2 is opened, dust is prevented from flowing from the peripheral passage area 5 into the operation area 2. When a door 21 between the peripheral passage area 5 and an equipment installation area 3 is opened, similarly, dust is prevented from flowing from the peripheral passage area 5 into the equipment installation area 3.

With the clean room 1 applied practically to semiconductor device manufacturing factories, an initial cost or an installation cost of chemical filters can be halved in comparison with that of chemical filters used in conventional clean rooms. A running cost of chemical filters can be reduced to one tenth in comparison with running costs of chemical filters used in the case of conventional clean rooms.

With use of an example in which chemical mist is ammonia, this effect will be described below. A concentration of ammonia in a conventional clean room without chemical filters is of the order of 5 ng/L (nanograms per liter). In order to decrease the concentration of ammonia to a target value of 0.05 ng/L or less, chemical filters are required to have removal efficiency of 99% or more. There is no single filter having such a removal efficiency at present, and therefore double chemical filters each having a removal efficiency of 90% are required for achieving the removal efficiency of 99%. In the clean room 1 of this embodiment, on the other hand, the equipment installation areas 3 where ammonia is generated is separated from the process areas 4 where ammonia is hardly generated. A concentration of ammonia in the process areas 4 is 0.5 ng/L in the state that the chemical filters 10 have been not installed. Consequently, in the process areas 4, the concentration of ammonia can be decreased to the target value of 0.05 ng/L or less by installation of only one chemical filter having a removal efficiency of 90%. Therefore, an initial cost of the chemical filters according to the present invention can be halved in comparison with that of chemical filters used in conventional clean rooms. The concentration of ammonia without chemical filters in conventional clean rooms is 5 ng/L, while the concentration of ammonia without chemical filters in the present invention is 0.5 ng/L. This ammonia concentration ratio of 10:1 equals a ratio of the running cost between the prior art and the present invention.

Wafers are conveyed by the SMIF system in this the embodiment. However, conveyance of wafers is not restricted to the SMIF system. For example, automatic conveying robots may be adopted to convey wafers.

As apparent from the above description, the clean room according to the present invention can prevent contamination of objects to be treated as well as reduction of a running cost of chemical filters.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A clean room comprising:
an equipment installation area where apparatus for treating an object to be treated is installed;
a process area where the object to be treated is loaded in the apparatus or unloaded from the apparatus; and
an operation area where the apparatus is operated,
wherein the equipment installation area, the process area and the operation area are so horizontally arranged in above-stated order as to be separated from one another via at least one partition extending from a ceiling to a first planar floor of the clean room,
wherein the equipment installation area, the process area and the operation area are air-conditioned independently of one another; and
wherein a pressure of the process area is set highest in the clean room.

2. The clean room as claimed in claim 1, wherein the process areas is air-conditioned with use of air that passes through a chemical filter, and the equipment installation area and the operation area are air-conditioned with use of air which passes through respective non-chemical filters.

3. The clean room as claimed in claim 1, further comprising:
a ceiling chamber provided under a ceiling in each of the equipment installation area, the process area and the operation area;
an objective region provided under the ceiling chamber and air-conditioned through a specified filter;
an underfloor region is provided under the objective region via a grating floor; and
a circulation duct through for returning air from the underfloor region to the ceiling chamber is provided.

4. The clean room as claimed in claim 1, wherein a plurality of process zones, each of which is formed by combination of the equipment installation area and the process area, are horizontally arranged via the operation area, and air conditioning in the plurality of process zones is performed independently of one another.

5. The clean room as claimed in claim 4, wherein an internal clean area formed by the plurality of process zones and the operation area is surrounded by a peripheral passage area via a partition, and the peripheral passage area is air-conditioned independently of the internal clean area.

6. The clean room as claimed in claim 5, wherein
an auxiliary machine area, in which an auxiliary machine for assisting an operation of the apparatus is installed on a second planar floor under the first floor of the clean room, is provided under the internal clean area via the first planar floor, and
the auxiliary machine area is air-conditioned independently of the internal clean area.

7. The clean room as claimed in claim 6, wherein a plurality of the auxiliary machines are installed in a common auxiliary machine area in which air circulates.

8. The clean room as claimed in claim 7, wherein the common auxiliary machine area communicates with the peripheral passage area to air-condition the auxiliary machine area and the peripheral passage area in common.

9. The clean room as claimed in claim 5, wherein
an air pressure in an area requiring a high degree of cleanliness is set higher than an air pressure in an area requiring a low degree of cleanliness in the internal clean area.

10. The clean room as claimed in claim 4, wherein
the object to be treated is conveyed from one of the process zones to another of the process zones only through the operation area.

11. The clean room as claimed in claim 5, wherein
an operator on the grating floor is allowed to come and go only between the peripheral passage area and the operation area and between the peripheral passage area and the equipment installation area.

12. The clean room of claim 1, wherein the process area is air-conditioned with use of air that passes through a chemical filter, and said equipment installation area and said operation area are air-conditioned with use of air that passes through respective non-chemical filters, so that said equipment installation area and said operation area do not have chemical filters which provide air directly into such areas.

* * * * *